(12) United States Patent
Yenney et al.

(10) Patent No.: US 8,295,777 B1
(45) Date of Patent: Oct. 23, 2012

(54) METHOD AND SYSTEM FOR AUTOMATED HANDOFF TESTING

(75) Inventors: Chris Yenney, Ashburn, VA (US); James Hodge, Gurley, AL (US); Wayne Winn, Lee's Summit, MO (US); Bruce Keith, Raymore, MO (US); Ryan Talley, Overland Park, KS (US)

(73) Assignee: Sprint Spectrum L.P., Overland Park, KS (US)

( * ) Notice: Subject to any disclaimer, the term of this patent is extended or adjusted under 35 U.S.C. 154(b) by 613 days.

(21) Appl. No.: 12/487,767

(22) Filed: Jun. 19, 2009

(51) Int. Cl.
*H04B 17/00* (2006.01)

(52) U.S. Cl. ............... 455/67.12; 455/67.11; 455/67.14; 455/435.1; 455/435.2; 455/436; 455/437; 455/438; 455/439; 455/442; 455/443

(58) Field of Classification Search .... 455/67.11–67.15, 455/436–443, 456.1, 435.2; 73/1.44, 856.6; 343/703; 250/506.1, 507.1, 518
See application file for complete search history.

(56) References Cited

U.S. PATENT DOCUMENTS

| | | | | |
|---|---|---|---|---|
| 5,668,562 | A * | 9/1997 | Cutrer et al. | 455/67.11 |
| 6,314,272 | B1 * | 11/2001 | Adrian et al. | 455/67.12 |
| 7,797,132 | B1 * | 9/2010 | Lele et al. | 702/182 |
| 2002/0065050 | A1 * | 5/2002 | Benezech et al. | 455/66 |
| 2002/0160717 | A1 * | 10/2002 | Persson et al. | 455/67.1 |
| 2008/0004021 | A1 * | 1/2008 | Sanjay | 455/436 |
| 2008/0305754 | A1 * | 12/2008 | Foegelle | 455/115.1 |

* cited by examiner

*Primary Examiner* — Nimesh Patel
*Assistant Examiner* — Thai Vu

(57) ABSTRACT

Methods and systems are disclosed for testing radio-frequency handoffs between two radio-frequency sources by a wireless communication device within an enclosed test chamber. The test chamber may include at least two radio-frequency antennas defining at least two radio-frequency coverage areas that are partially separated by a radio-frequency barrier wall. A wireless communication device may be moved within the test chamber while radio-frequency conditions and handoff status may be monitored by a control system.

18 Claims, 4 Drawing Sheets

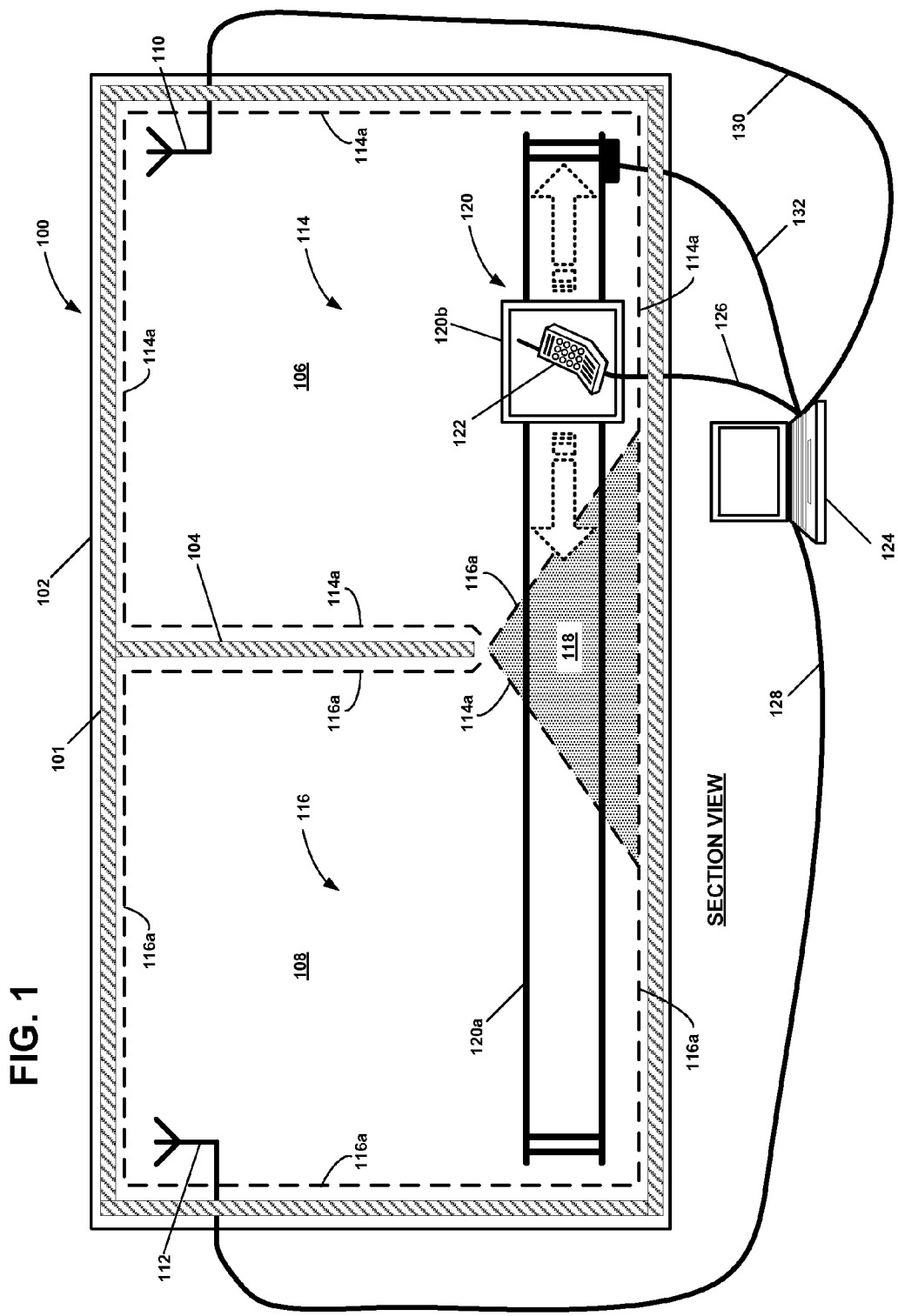

VIEW A-A

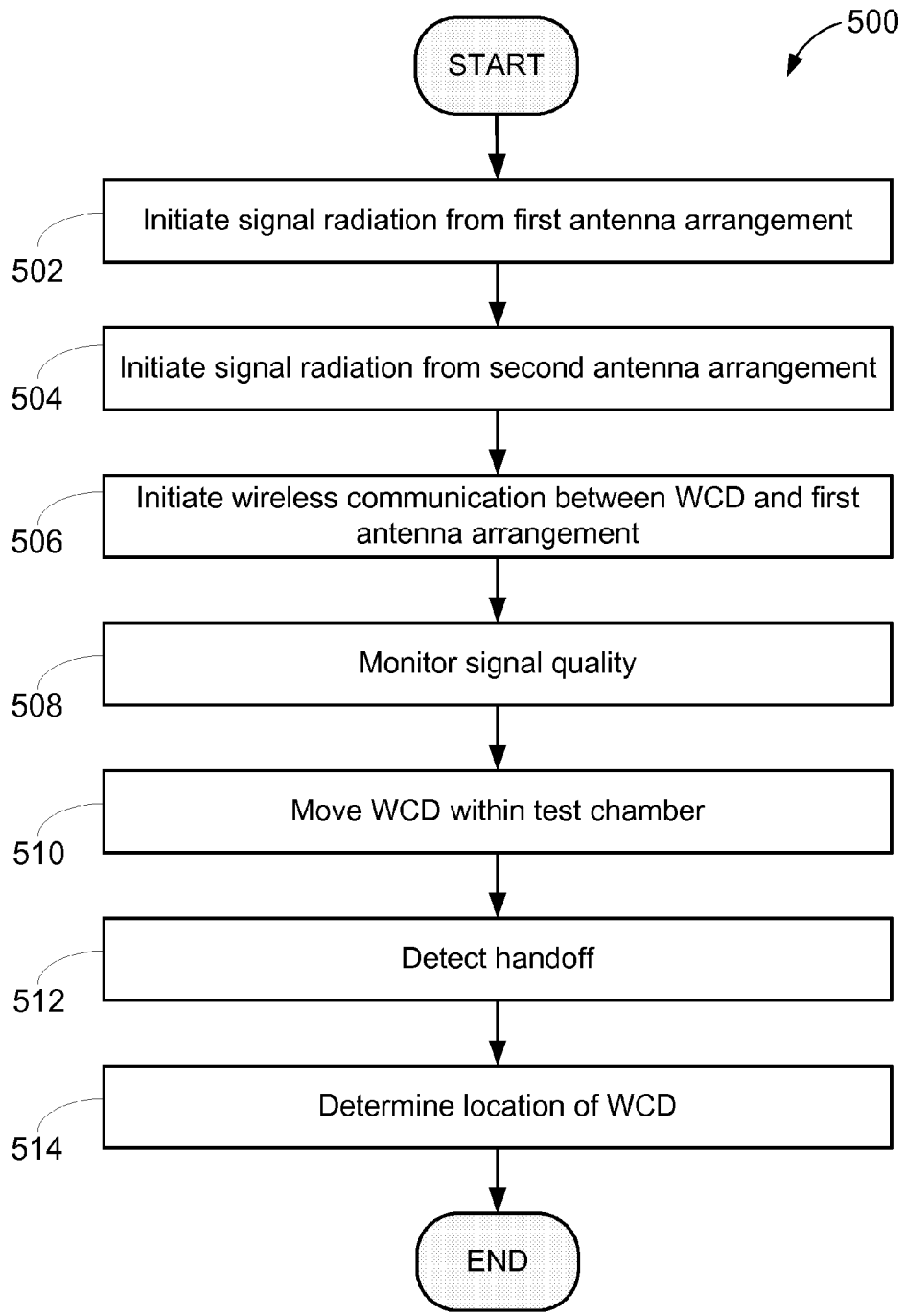

METHOD AND SYSTEM FOR AUTOMATED HANDOFF TESTING

BACKGROUND

In wireless communications, the term handoff generally refers to the process of transferring an ongoing voice call or data session (collectively, "a call") from one wireless communication network channel to another wireless communication network channel. The term handoff may also refer to the process of adding or removing additional communication channels to the communication path of a wireless communication device (WCD) communicating on a wireless network. One situation in which a handoff might occur is when a WCD moves away from a first radio-frequency (RF) coverage area source and enters a second RF coverage area. The call may be transferred to the second RF coverage area in order to avoid call termination when the WCD moves outside the first coverage area. As another example, when another channel interferes with the communication channel used by the WCD, the call may be transferred to a different channel in the same coverage area or to a different channel in another coverage area in order to avoid the interference.

Handoffs may also occur when a WCD call moves between an umbrella coverage area and a micro-coverage area, or vice-versa, such as when a call transfers between a typical telecommunications cellular antenna coverage area and a femtocell. A femtocell, also known as an Access Point Base Station, may be a small cellular base station, typically designed for use in residential or small business environments. The femtocell may connect to a service provider's network via broadband (such as DSL or cable) and it typically allows service providers to extend service coverage indoors, especially where access to the umbrella coverage area would otherwise be limited or unavailable. The femtocell incorporates the functionality of a typical base station but extends it to allow a simpler, self-contained deployment. The femtocell concept is applicable to all wireless communication standards, including, but not limited to: time division multiple access (TDMA) systems, global system for mobile communications (GSM) systems, Worldwide Interoperability for Microwave Access (WiMAX or IEEE 802.16) systems, code division multiple access (CDMA or CDMA2000) systems, or time division-synchronous code division multiple access (TD-SCDMA) systems.

Handoffs may generally be categorized as either "soft" or "hard." A soft handoff is a handoff in which a channel in a first coverage area is retained and used in parallel, at least temporarily, with a channel in a second coverage area. In a soft handoff, the connection to the second coverage area is established before the connection to the first coverage area is broken. The interval during which the two connections are used in parallel may be brief or substantial. A soft handoff may also involve using connections in more than just two coverage areas, for example, one WCD may maintain connections to three, four, or more coverage areas at the same time.

One advantage of soft handoffs is that the connection to the first coverage area is broken only when a reliable connection to the second coverage has been established. Therefore, the chances that the call will be terminated abnormally due to a failed handoff are lower. By adjusting the duration of soft handoffs and the size of the areas in which they occur, network engineers can balance the benefit of extra call reliability against the price of reduced call capacity due to the simultaneous use of multiple channels. Thus, there is a benefit to testing how soft handoffs may occur between coverage areas.

A hard handoff is a handoff in which a channel in a second coverage area is engaged only when the channel in a first coverage area is released. Thus the connection to the first coverage area is broken before the connection to the second coverage area is made. Hard handoffs are intended to be instantaneous in order to minimize the disruption to the call. In general, a hard handoff is usually not perceptible by the user.

An advantage of the hard handoff is that, at any moment in time, a given call uses only one channel. A disadvantage is that if a handoff fails, the call may be temporarily disrupted or even terminated. Just as with soft handoffs, network engineers must weigh and balance the benefits and disadvantages of hard handoffs by, among other things, analyzing the timing, software parameters, and signal parameters of hard handoffs. Thus, there is a benefit to testing how hard handoffs may occur between coverage areas.

Overview

Disclosed herein are methods and systems for testing WCD handoffs within an RF test chamber. In particular, disclosed is a system comprising a radio frequency test chamber that defines an enclosure having an internal wall that partially separates a first portion of the enclosure from a second portion of the enclosure, but that leaves space for a wireless communication device to be moved within the enclosure from a first position in the first portion to a second position in the second portion. The system may further include a first RF antenna arrangement that radiates within the first portion to define a first coverage area, where the first coverage area spans the first portion and extends beyond the internal wall into just part of the second portion. Additionally, a second RF antenna arrangement may radiate within the second portion to define a second coverage area, where the second coverage area spans the second portion and extends beyond the internal wall into just part of the first portion, thereby overlapping in part with the first coverage area. Within the system, a transport mechanism may be operable to move the wireless communication device along a path within the chamber from the first position to the second position. Additionally, a control system may control the transport mechanism's movement of the wireless communication device along the path, and may also control RF emission by the first RF antenna arrangement and by the second RF antenna arrangement. The control system may also detect when the wireless communication device hands off from the first coverage area to the second coverage area as the wireless device is moved along the path.

Also disclosed is a method for testing handoff of a wireless communication device in a radio frequency test chamber, where the test chamber defines an enclosure having an internal wall that partially separates a first portion of the enclosure from a second portion of the enclosure. In the disclosed method, a first antenna arrangement radiates to define a first RF coverage area spanning the first portion and extending beyond the internal wall into just part of the second portion. A second antenna arrangement also radiates to define a second RF coverage area spanning the second portion and extending beyond the internal wall into just part of the first portion, thereby overlapping in part with the first coverage area. Wireless communication between a wireless communication device and the first antenna arrangement may be initiated; and, while the wireless communication between the device and the first antenna arrangement is underway, the device may be moved within the test chamber along a path that starts in the first RF coverage area and ends in the second RF coverage area, so as to invoke a handoff of the device from the first RF coverage area to the second RF coverage area. The handoff may then be detected. One or more of the parameters regarding the handoff may be noted or recorded to facilitate analysis of how handoffs occur between coverage areas.

The foregoing as well as other aspects, advantages, and alternatives will become apparent to those of ordinary skill in the art by reading the following detailed description, with reference where appropriate to the accompanying drawings.

BRIEF DESCRIPTION OF THE DRAWINGS

FIG. 1 is a block diagram sectional view of a system in which an exemplary embodiment of the claimed system and method can be implemented;

FIG. 5 is a flow chart depicting functions carried out in accordance with an exemplary embodiment.

DETAILED DESCRIPTION

Figure 2A:
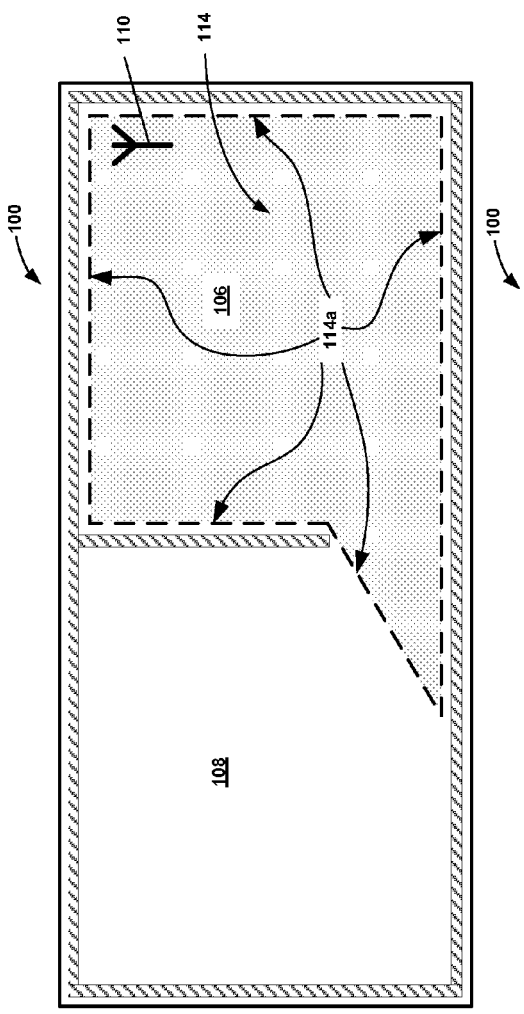
FIG. 2A is a block diagram showing a subset of elements of FIG. 1.

While one or more embodiments are discussed generally in the context of CDMA wireless communication systems, it will be appreciated that the method is not limited in this respect and that the method may be implemented in any number of types of wireless communication systems, such as TDMA, GSM, WiMAX, CDMA/CDMA2000, and TD-SCDMA systems. As in most telecommunication and data applications, it will also be appreciated that many of the elements of the various embodiments described herein are functional entities that may be implemented with hardware, firmware and/or software. Additionally, many of these elements may be implemented as discrete components or in conjunction with other components, in any suitable combination and location.

Referring to the drawings, FIG. 1 is a block diagram depicting a system in which a preferred embodiment of the claimed systems and methods for testing handoffs could be implemented. The system first includes an RF test chamber 100 (shown in a representative section view) in which a WCD 122 can be moved from a first RF coverage area 114 to a second RF coverage area 116 to test the handoff of the WCD 122 between the coverage areas 114 and 116.

The test chamber 100 is preferably a three-dimensional rectangular enclosure 101 with a shell 102. Preferably, the test chamber 100 is about 3 feet to about 15 feet in length along the long axis, although that size is not contemplated as a limitation. The test chamber 100 may be significantly larger or smaller in scale. The section view of test chamber 100 shown in FIG. 1 is representative only and may be considered a top view or a side view. Preferably, the shell 102 will prevent the intrusion of, or significantly attenuate, undesirable external RF radiation into the interior of the test chamber 100. The enclosure 101 and shell 102 may be separate entities; for example, the shell 102 may encompass the enclosure 101, the shell 102 may be integrated within the enclosure 101 material, or the shell 102 may line the interior of the enclosure 101. Alternatively, the shell 102 and enclosure 101 may be a single construct, where the shell 102 material is the enclosure 101.

To prevent or attenuate RF intrusion, the shell 102 may be constructed of metal plate, metal screen, and/or other RF blocking or attenuating materials, or a combination of RF blocking or attenuating materials. For example, portions of the shell 102 may comprise metal screen and other portions of the shell 102 may comprise a conductive glass, such as DataStop® Conductive Glass, or a non-conductive structural material coated in an RF attenuating film, such as CLEAR-SHIELD™ Plastic Film. Preferably, the shell may act as a Faraday cage to block or substantially attenuate external RF radiation.

Preferably, the test chamber 100 may be partially separated into two or more interior portions (e.g., a first portion 106 and a second portion 108) by an interior wall 104. The interior wall 104 may be constructed of, or include, or be covered by, an RF blocking or attenuating material so that RF radiation does not pass through the wall 104.

Figure 2B:
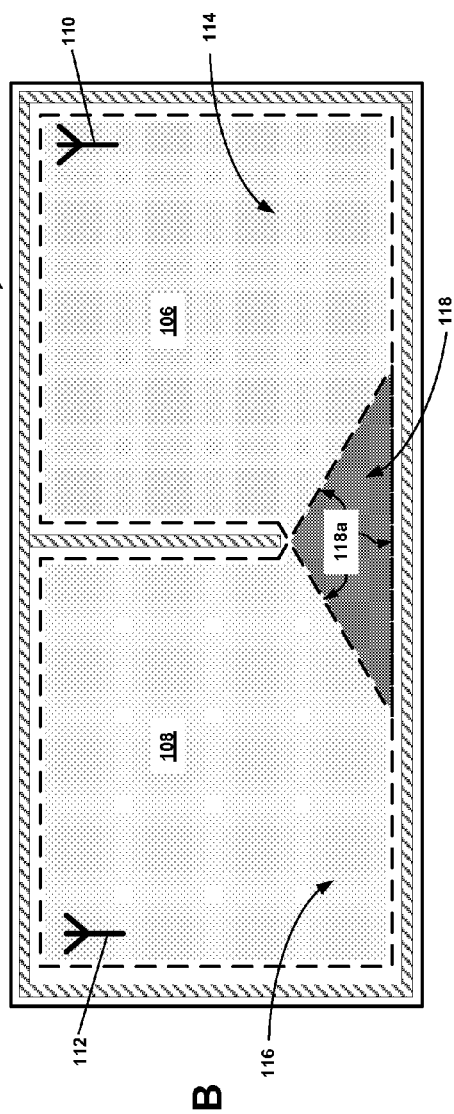
FIG. 2B is a block diagram showing a subset of elements of FIG. 1.

A first antenna arrangement 110 may be located so that it can radiate an RF signal throughout the first portion 106 and just part way into the second portion 108. Preferably, the first antenna arrangement 110 may be located within the first portion 106 near the end of the test chamber 100 opposite the interior wall 104, and diagonally opposite of the opening between the interior portions 106 and 108 that is formed by the partial interior wall 104, as illustrated in FIG. 1. This allows the antenna arrangement 110 to radiate RF in a first coverage area 114, as illustrated by the first coverage area boundary 114a. FIGS. 1, 2A, and 2B show coverage area boundaries that are slightly offset from the interior walls of the test chamber 100, however that offset is for illustrative purposes only and would not necessarily be present in an actual test chamber. FIG. 2A shows a simplified view of the first coverage area 114 in the test chamber 100.

Alternatively, the first coverage area 114 need not span the entire first portion 106. For example, the antenna arrangement 110 may be a directional antenna and may span only a fraction of first portion 106, while still extending just part way into second portion 108.

Similarly, and as shown in FIG. 1 and FIG. 2B, a second antenna arrangement 112 may be located so that it can radiate an RF signal throughout the second portion 108 and just part way into the first portion 106. Preferably, the second antenna arrangement 112 may be located within the second portion 108 near the end of the test chamber 100 opposite the interior wall 104, and diagonally opposite of the opening between the interior portions 106 and 108 that is formed by the partial interior wall 104, as illustrated in FIG. 1. This location allows the antenna arrangement 112 to radiate RF in a second coverage area 116, as illustrated by the second coverage area boundary 116a shown in FIG. 1. The second coverage area 116 need not span the entire second portion 108. For example, the antenna arrangement 112 may be a directional antenna and may span only a fraction of second portion 108, while still extending just part way into first portion 106.

To aid handoff testing from the first antenna arrangement 110 to the second antenna arrangement 112, it is preferred that first coverage area 114 and second coverage area 116 overlap in a region, such as in overlap area 118, with an overlap boundary area 118a, as shown in FIG. 2. In addition to the RF blocking performed by the interior wall 104, the power level supplied to the first antenna arrangement 110 and the second antenna arrangement 112 may be manipulated to create a particular shape or RF profile of the overlap area 118.

Figure 4A:
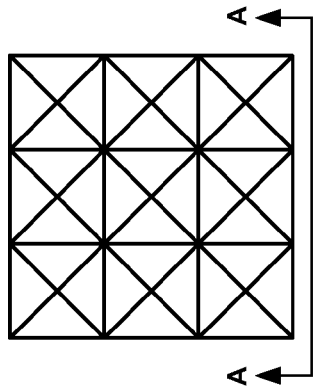
FIG. 4A is a top view of an arrangement of multiple instances of the pyramidal radiation absorbent material depicted in FIG. 3.
Figure 4B:
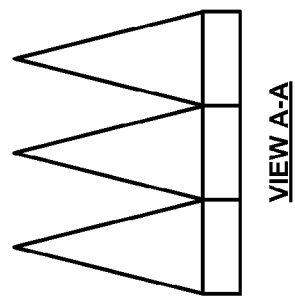
FIG. 4B is a side view of the arrangement in FIG. 4A.
Figure 3:
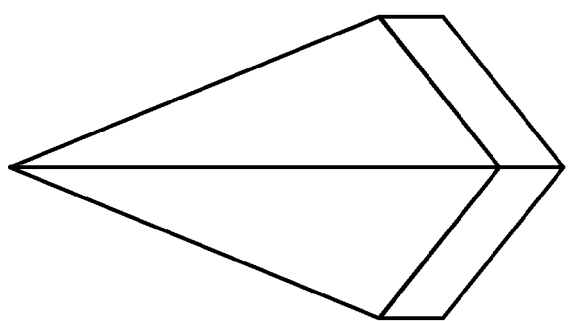
FIG. 3 is a diagram of a pyramidal radiation absorbent material.

Preferably, some or all of the interior surfaces of the test chamber 100 may be lined with a radiation absorbent material ("RAM") that reduces or eliminates the reflection of RF waves. For example, FIG. 3 illustrates an exemplary pyramidal RAM shape known in the art that may be used in the present embodiment. Pyramidal RAM is commonly found in anechoic chambers that are used for measuring electromagnetic radiation, such as RF, and it is the preferred RAM in this embodiment. Generally, the pyramidal RAM is fireproofed urethane foam impregnated with carbon black and cut into long pyramids. Various arrangements of pyramidal RAM, such as the one shown for exemplary purposes only in FIGS. 4A and 4B, may be attached to some or all of the interior surfaces of the test chamber 100. The pyramidal RAM may preferably be applied to the chamber walls with the tips of the pyramids pointing inward, towards the interior of the test chamber, or the interior of each portion 106 and/or 108. Alternatively, the tips may be oriented towards the source of RF radiation, i.e., the antenna arrangements 110 and/or 112. As the RF strikes the pyramidal RAM, it experiences a gradual transition from free space at the tip of the pyramid to absorbing foam at the base, thus attenuating the RF energy. As is commonly known in the art, the pyramid shape and carbon black concentration can be optimized to attenuate various RF frequencies.

Other RAMs are possible as well. Various carbon-impregnated foam absorbers are commercially available in flat sheets, where the foam absorbers employ an increasing gradient of carbon loadings in different foam layers to attenuate the RF energy. Also, neoprene polymer sheets with ferrite grains or carbon black particles (containing about 30% of crystalline graphite) embedded in the neoprene polymer matrix are sometimes used as a RAM. As another example, albeit a less common one, iron ball paint (i.e., a paint containing tiny spheres coated with carbonyl iron or ferrite) may be used to coat interior surfaces of the test chamber 100.

A Jaumann absorber (or Jaumann layer) is another possible RAM. A Jaumann absorber may consist of two equally-spaced reflective surfaces and a conductive ground plane. The Jaumann absorber is a resonant absorber (i.e., it uses wave interference to cancel the reflected wave) and it requires a $\lambda/4$ spacing between the first reflective surface and the ground plane and between the two reflective surfaces (a total of $\lambda/4+\lambda/4$), where $\lambda$ is a wavelength of an RF signal that is to be attenuated.

Any of the above RAMs may be used in conjunction with each other to produce an interior surface that reduces or eliminates RF reflection. Preferably, the pyramidal RAM may be used to line the interior walls of the enclosure 101 and all exposed sides of the interior wall 104. Where it is not possible to place an arrangement of pyramidal RAM, one of the other RAMs may be used to cover an interior section of the enclosure 101.

A transport mechanism 120 may also be included in test chamber 100. The transport mechanism 120 may be capable of transporting a WCD 122, such as a Sanyo 9000 cellular phone, from a first position in the first portion 106 to a second position in the second portion 108. The transport mechanism 120 may include a holder 120b for securing, clamping, supporting or otherwise holding the WCD 122. For example, the holder 120b may be a simple tray or a cellular phone docking station.

Preferably, the transport mechanism 120 can move the WCD 122 from a first position exclusively within the first coverage area 114, through the overlap coverage area 118, and to a second position exclusively within the second coverage area 116. However, the first position and second position need not be exclusively within any specific coverage area. The locations of the first and second positions can be changed as desired for particular testing setups. For example, the WCD 122 may start in the first coverage area 114 and stop in the overlap coverage area 118. As another example, the WCD 122 may start and stop in the overlap coverage area 118.

The internal wall 104 may be configured so that it leaves space for the transport mechanism 120 to move the WCD 122 from a first position in the first portion 106 to a second position in the second portion 108. To reduce the intrusion of RF radiation from the first antenna arrangement 110 into the second portion 108, and to reduce the intrusion of RF radiation from the second antenna arrangement 112 into the first portion 106, the internal wall 104 is preferably configured so that the opening between first portion 106 and the second portion 108 is just large enough to allow the transport mechanism 120 and the WCD 122 to pass through. As an example, if the test chamber 100 is a six-sided, three-dimensional rectangular box, as represented by the section view shown in FIG. 1, the internal wall 104 may contact three of the long sides of the test chamber 100 (e.g., a top wall, a bottom wall, and a side wall of the test chamber 100), leaving just enough distance between the internal wall 104 and the fourth long side of the test chamber 100 so that the transport mechanism 120 and the WCD 122 are able to pass through. As another example, not shown, the internal wall 104 may contact four long walls of the test chamber 100 (e.g., a top wall, a bottom wall, and two side walls), but have an aperture that is sized so as to just allow the transport mechanism 120 and the WCD 122 to pass through the aperture.

The transport mechanism 120 preferably includes a transport means 120a for moving the WCD 122 via the holder 120b from a first position to a second position within the test chamber 100. For example, the transport means 120a may include a conveyer belt system which may include a conveyer belt, a drive system such as belt rollers, a drive motor connected to the drive system, an energy supply, and motive controls. As another example, the transport means 120a may include a linear slide or bearing rail system with corresponding rail carriages fastened to the rails and the holder 120b, a drive mechanism such as a ball screw system connected to the carriages, a drive motor connected to the ball screw system, an energy supply, and motive controls. Other examples are possible as well and these examples are not intended to limit the means by which the transport mechanism 120 may move the WCD 122 from a first position to a second position within the test chamber 100.

Preferably, the transport mechanism 120 may further include one or more velocity and/or position sensors usable by a control system 124 to determine the WCD's 122 (or holder's 120b) velocity and/or position in the test chamber 100 during movement. The sensors may be integrated with the motive controls or drive motor, or the sensors may be discrete components. For example, a velocity and position sensor may comprise a rotary encoder on the shaft of a drive motor for the transport means 120a. The rotary encoder may report the position and/or rotational speed of the shaft, from which the position and/or linear velocity of the WCD 122 can be determined.

The transport mechanism 120 may also include a cable management system to allow wires, fiber optic cables, or other leads to travel with the WCD 122 without binding in the transport means 120a. For example, the cable management system might include a flexible cable track system, such as an E-Z Chain plastic track by Energy Chain Systems®, where the track system may carry a communication cable 126 (e.g., a Universal Serial Bus ("USB") cable) connecting the WCD 122 to the control system 124.

The cable 126 may pass through the enclosure 101 (and shell 102, if applicable) to connect the WCD 122 and the control system 124. Preferably, the pass-through location is shielded to prevent the intrusion of external RF. For example, the cable 126 may pass through an aperture that is sealed with a grommet around the cable 126. Alternatively, the cable 126 may comprise multiple components, including a double-ended bulkhead pass-through connector that has fittings on the interior and exterior of the enclosure 101 (and shell 102, if applicable) that serve to connect a first exterior length of the cable 126 to a second interior length of the cable 126.

The control system 124 may be physically integrated with the test chamber 100, or may exist as a standalone unit. The control system 124 preferably includes a laptop or other personal computer equipped with transport mechanism control software and diagnostic and monitoring software, such as Qualcomm's eXtensible Diagnostic Monitor (QxDM) software. The control system 124 may further include one or more cellular BTSes and/or femtocell BTSes (i.e., Access Point Base Stations).

The transport mechanism 120 control software may be any motion control software that allows the control system 124 to start and stop movement of the transport mechanism 120 via cable 132. The cable 132 may pass through the enclosure 101 (and shell 102, if applicable) to connect the transport mechanism 120 and the control system 124. Preferably, the pass-through location is shielded similarly to cable 126 to prevent the intrusion of external RF.

Preferably, the control system 124 may control the speed of the transport mechanism 120, so as to allow the WCD 122 to progress from a first position to a second position within the test chamber 100 at a variety of speeds. As an example, the speed control may be accomplished by the control system 124 sending control signals to a motive control system of the transport mechanism 120, or by the control system 124 controlling the voltage and/or current supplied to the drive motor of the transport mechanism 120.

Additionally, the control system 124 may be operable, in conjunction with the transport mechanism 120 sensors, to determine and/or control the location of the WCD 122 within the test chamber 100 at any time. The location control may be accomplished similarly to the speed control, where the control system control 124 sends control signals to, or varies the energy supplied energy to, the transport mechanism 120 drive system. The location determination, as an example, may be accomplished by the control system 124 reading signals transmitted by a rotary encoder that is part of the transport mechanism 120, and then using those signals to calculate a travel distance or absolute position of the WCD 120 (or holder 122b) within the test chamber 100. Other location determination systems are contemplated as well, and both or either closed and open-loop systems may be used. The location may be a physical location with the test chamber 100, such as an X-Y coordinate location, or the location may be a relative location, such as a distance from a first position, or a distance from the antenna arrangements 110 and/or 112. Preferably, the control system 124 determines at least the location of the WCD 122 when a handoff occurs.

The control system 124 may be connected to the antenna arrangements 112 and 110 by communication paths 128 and 130, respectively. The communication paths 128 and 130 may include cables that pass through the enclosure 101 (and shell 102, if applicable) to connect the antenna arrangements 112 and 110 and the control system 124. Preferably, the pass-through location is shielded to prevent the intrusion of external RF. For example, the cables may pass through an aperture that is sealed with a grommet around the cables. Alternatively, the cables may comprise multiple components, including a double-ended bulkhead pass-through connector that has fittings on the interior and exterior of the enclosure 101 (and shell 102, if applicable) that serve to connect a first exterior length of the cable to a second interior length of the cable.

The paths 128 and 130 may allow an RF signal generated and/or controlled by the control system 124 to be broadcast by the antenna arrangements 112 and 110. As an example, paths 128 and 130 may comprise electrical conductor cables or fiber optic cables. Additionally, paths 128 and 130 may include additional signal equipment, such as signal amplifiers, modulators, de-modulators, fiber-optic to electrical converters, or other signal processing equipment. Also, the power level supplied to the first antenna arrangement 110 and the second antenna arrangement 112 may be controlled by the control system 124 to create a particular shape or RF profile of the overlap area 118.

The combination of the control system 124 and antenna arrangements 110 and 112 may be configured such that the RF signal in the first wireless coverage area 114 and/or the RF signal in the second wireless coverage area 116 each may emulate a variety of wireless broadcast signals, all under the control of the control system 124. Preferably, the first RF coverage area 114 may emulate a cellular femtocell signal and the second RF coverage area 116 may emulate a large-scale cellular BTS signal. Thus, the test chamber 100 may be used to test the handoff of a WCD 122 from a femtocell to a BTS in a simulated cellular network.

The antenna arrangements 110 and 112 may also function as receiving antennas. For example, the combination of the control system 124 and antenna arrangements 110 and 112 may be configured to receive communications from the WCD 122. Thus, each antenna arrangement 110 and 112 may function as a transceiver, such as a BTS transceiver and/or a femtocell transceiver.

The control system 124 may further include an RF power meter, such as an Agilent Technologies RF power meter, to collect measurements of RF power in the test chamber via either or both of the antenna arrangements 110 and/or 112, and/or an antenna arrangement located elsewhere in the test chamber 100 (not shown in FIG. 1).

The control system 124 may also control functions of the WCD 122. Preferably, the control system 124 may be able to set up a call by instructing the WCD 122, via the control cable 126, to initiate a call to the first antenna arrangement 110. The control system 124 could also, among other activities, broadcast a pilot signal from each antenna arrangement 110 and 112, and broadcast any other standard call setup messages from the first antenna arrangement 100 and/or the second antenna arrangement 112. Additionally, during origination, the control system 124 could send, via the first antenna arrangement 110, a Candidate Frequency Search Request Message ("CFSRQM") to the WCD 122, where the CFSRQM would provide the information the WCD 122 may need to search for, and trigger, a handoff.

Preferably, once the call is setup, the control system 124 may instruct the transport mechanism 120 to begin moving the WCD 122. Alternatively, control system 124 may instruct the transport mechanism to begin moving prior to the call setup, or as the call is being setup.

Turning now to handoff detection, the handoff process typically involves the WCD 122 monitoring signal data from the first RF coverage area 114 and/or from the second RF coverage area 116, and using that signal data as criterion for searching for handoff candidates and for initiating a handoff. For example, the WCD 122 may monitor the signal quality of the RF radiation in the RF coverage areas 114 and 116, and use that signal quality to determine when to accomplish a handoff.

In both analog and digital wireless communication systems, two useful measures of signal quality are the received signal power and the received signal-to-noise ratio. Additionally, in digital non-CDMA wireless systems, the signal quality may also be the received signal power, the bit error rate (BER), block error/erasure rate (BLER), the received quality of speech (RxQual), estimates of the radio signal propagation delay, and/or other metrics. In digital CDMA wireless systems, the signal quality criterion for requesting a handoff may additionally be the $E_c/I_o$ ratio measured in a pilot channel, the received signal code power (RSCP), and/or other metrics. For example, in a digital CDMA system, a CFSRQM broadcast to the WCD 122 might include information indicating that the WCD 122 should search for a handoff candidate, and then execute a handoff, when the received $E_c/I_o$ value reaches −12 dB. Alternatively, the CFSRQM might include information describing an RSCP handoff trigger level, instead of, or in addition to, an $E_c/I_o$ trigger level.

The WCD 122 may report any handoffs, its monitored signal data, and any other RF communications, back to the control system 124 via the communications cable 126. The control system 124 may utilize its diagnostic and monitoring software to receive and analyze such information. Preferably, the information may be transmitted by the WCD 122 in layer 3 messages which are parsed out into meaningful text by the diagnostic and monitoring software. Alternatively or additionally, the control system 124 may monitor the signal quality of the RF radiation in RF coverage areas 114 and 116, and any communications with the WCD 122, through the antenna arrangements 110 and/or 112, or through another antenna arrangement connected to the control system 124 (not shown in FIG. 1). For example, via either the cable 126 or the antenna arrangements 110 and/or 112, the WCD 122 may transmit, and the control system 124 may receive, a Candidate Frequency Search Report Message ("CFSRPM"), in which the WCD 122 reports PN signals it found when it searched for a handoff candidate. As another example, the WCD 122 may receive a handoff indication via RF communications, such as a Universal Handoff Direction Message (UHDM), and the control system 124 may monitor the receipt of that message by the WCD 122. Additionally and preferably, once the control system 124 records a handoff indication from the WCD 122, the control system 124 may determine the location of the WCD 122, as previously described.

The flowchart of FIG. 5 illustrates a method 500 of the present invention. The method 500 may be implemented in the system described with respect to FIG. 1, or in other systems. At step 502, signal radiation may be initiated from the first antenna arrangement 110. Preferably, the signal is sent from the control system 124, and the signal emulates a femtocell cellular signal. At step 504, signal radiation may be initiated from the second antenna arrangement 112. Preferably, the second signal is sent from the control system 124, and the second signal emulates a BTS cellular signal. At step 506, wireless communication between the WCD 122 and the first antenna arrangement 110 is initiated. Preferably, a call is set up between WCD 122 and the first antenna arrangement 100.

At step 508, the signal quality experienced by the WCD 122 may be monitored. Preferably, the monitoring is performed by the control system 124. At step 510, prior to, during, or after the call is set up, the WCD 122 may be moved within the test chamber 100. The WCD may be moved along a path that starts in the first RF coverage area 114 and ends in the second RF coverage area 116. At some point along the path, the WCD 122 performs a handoff from the first antenna arrangement 110 to the second antenna arrangement 112, and the handoff is detected at step 512 by the control system 124.

At step 514, the location of the WCD 122 may be determined. Preferably this occurs when the handoff is detected at step 512. Additionally or alternatively, the location may be determined at various times, such as prior to the WCD 122 being moved, or at intervals during movement of the WCD 122.

The methods and systems described herein are beneficial for at least the following reasons. Low Cost Internet Base Station (LCIB) devices (such as femtocells) promise network operators the ability to improve coverage, and LCIB devices also give operators new revenue opportunities by offering a low cost, low capacity base station product that consumers and small businesses can self-install in their homes and offices. The need to be low cost means that the LCIB devices typically have very low capacity resources such as RF power, channel elements, and RF carrier capability, in comparison to standard large-scale outdoor BTS cellular stations In fact, most LCIB devices have only one traffic carrying RF carrier (or one RF carrier per technology, when multiple technologies are supported). Because LCIB devices have such limited resources, it is desirable to study the handoff parameters particularly associate with LCIB devices, as low RF resources can limit the handoff capabilities and potentials of WCDs. Typically, handoff analysis and study may involve moving a WCD in to, through, and/or out of an LCIB coverage area, which can involve a significant amount of physical travel time, depending on the size of the LCIB coverage area. In many cases, the WCD and an associated diagnostic device must be walked or even driven around in order to test varying RF profiles within an LCIB coverage area. By limiting an LCIB coverage area to a defined interior space within a small-scale test chamber, the embodiments described herein allow an operator to test WCD handoffs from an LCIB device to a BTS without having to travel long distances between the RF sources in order to trigger a handoff. Additionally, WCD locations within a given RF coverage area profile can be more precisely controlled and repeated, and test-to-test cycle times can be improved dramatically. Also, the influence of external RF sources can be drastically reduced or eliminated.

Exemplary embodiments have been shown and described herein. Those of ordinary skill in the art will appreciate that numerous modifications from the embodiments described are possible, while remaining within the scope of the claims.

We claim:

1. A system for testing handoff of a wireless communication device, the system comprising:
   a radio frequency (RF) test chamber defining an enclosure having an internal wall that partially separates a first portion of the enclosure from a second portion of the enclosure but that leaves space for a wireless communication device to be moved within the enclosure from a first position in the first portion to a second position in the second portion;
   a first RF antenna arrangement that radiates within the first portion to define a first coverage area, wherein the first coverage area spans the first portion and extends beyond the internal wall into just part of the second portion;
   a second RF antenna arrangement that radiates within the second portion to define a second coverage area, wherein the second coverage area spans the second portion and extends beyond the internal wall into just part of the first portion, thereby overlapping in part with the first coverage area;

a transport mechanism operable to move the wireless communication device along a path within the chamber from the first position to the second position; and a control system that controls the transport mechanism's movement of the wireless communication device along the path, that controls RF emission by the first RF antenna arrangement and by the second RF antenna arrangement, and that detects when the wireless communication device hands off from the first coverage area to the second coverage area as the wireless device is moved along the path.

2. The system of claim 1, further comprising a lining material covering at least some interior surfaces of the test chamber, wherein the lining material attenuates reflection of RF radiation within the test chamber.

3. The system of claim 2, wherein the lining material is a pyramidal radiation absorbent material.

4. The system of claim 1, further comprising a shell encompassing the enclosure, wherein the shell reduces intrusion of external RF radiation into the enclosure.

5. The system of claim 4, wherein the shell is a Faraday cage.

6. The system of claim 1, wherein the interior wall: (i) prevents the first RF coverage area from encompassing all of the second RF coverage area, and (ii) prevents the second RF coverage area from encompassing all of the first RF coverage area.

7. The system of claim 1, wherein the control system initiates a call between the wireless communication device and the first RF antenna arrangement.

8. The system of claim 1, wherein the control system determines a location of the wireless communication device, wherein the location indicates the location of the device when the handoff occurred.

9. The system of claim 1, wherein the control system monitors a signal quality experienced by the wireless communication device.

10. The system of claim 9, wherein the signal quality is $E_c/I_o$.

11. A method for testing handoff of a wireless communication device in a radio frequency (RF) test chamber, the test chamber defining an enclosure having an internal wall that partially separates a first portion of the enclosure from a second portion of the enclosure, the method comprising:

initiating RF radiation by a first antenna arrangement to define a first RF coverage area spanning the first portion and extending beyond the internal wall into just part of the second portion;

initiating RF radiation by a second antenna arrangement to define a second RF coverage area spanning the second portion and extending beyond the internal wall into just part of the first portion, thereby overlapping in part with the first coverage area, wherein the internal wall (i) prevents the first RF coverage area from encompassing all of the second RF coverage area, and (ii) prevents the second RF coverage area from encompassing all of the first RF coverage area;

initiating wireless communication between a wireless communication device and the first antenna arrangement;

while the wireless communication between the device and the first antenna arrangement is underway, moving the device within the test chamber along a path that starts in the first RF coverage area and ends in the second RF coverage area, so as to invoke a handoff of the device from the first RF coverage area to the second RF coverage area; and detecting when the handoff occurs.

12. The method of claim 11, wherein the test chamber includes a lining material covering at least some interior surfaces of the test chamber, wherein the lining material attenuates reflection of RF radiation within the test chamber.

13. The method of claim 12, wherein the lining material is a pyramidal radiation absorbent material.

14. The method of claim 11, wherein the test chamber includes a shell encompassing the enclosure, wherein the shell reduces intrusion of external RF radiation into the enclosure.

15. The method of claim 14, wherein the shell is a Faraday cage.

16. The method of claim 11, further comprising determining a location of the wireless communication device, wherein the location indicates the location of the device when the handoff occurred.

17. The method of claim 11, further comprising monitoring a signal quality experienced by the wireless communication device.

18. The method of claim 17, wherein the signal quality is $E_c/I_o$.

* * * * *